(12) United States Patent
Nishizawa

(10) Patent No.: US 9,385,686 B2
(45) Date of Patent: Jul. 5, 2016

(54) ACOUSTIC WAVE DEVICE

(71) Applicant: TAIYO YUDEN CO., LTD., Tokyo (JP)

(72) Inventor: Toshio Nishizawa, Kanagawa (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 34 days.

(21) Appl. No.: 14/304,723

(22) Filed: Jun. 13, 2014

(65) Prior Publication Data

US 2014/0368296 A1    Dec. 18, 2014

(30) Foreign Application Priority Data

Jun. 18, 2013    (JP) .................................. 2013-127368

(51) Int. Cl.

| | |
|---|---|
| *H03H 9/72* | (2006.01) |
| *H03H 9/08* | (2006.01) |
| *H03H 9/64* | (2006.01) |
| *H03H 9/02* | (2006.01) |
| *H03F 3/24* | (2006.01) |
| *H03H 9/05* | (2006.01) |

(52) U.S. Cl.
CPC ........... *H03H 9/725* (2013.01); *H03H 9/02834* (2013.01); *H03H 9/08* (2013.01); *H03H 9/6489* (2013.01); *H03F 3/245* (2013.01); *H03F 2200/171* (2013.01); *H03H 9/02574* (2013.01); *H03H 9/02929* (2013.01); *H03H 9/0576* (2013.01)

(58) Field of Classification Search
CPC .............. H03F 3/245; H03F 2200/171; H03H 9/02574; H03H 9/02834; H03H 9/02929; H03H 9/725; H03H 9/0576; H03H 9/08; H03H 9/6489
USPC .......... 333/133, 193–196; 310/313 A, 313 B, 310/346
See application file for complete search history.

(56) References Cited

U.S. PATENT DOCUMENTS

| | | | | |
|---|---|---|---|---|
| 2004/0226162 | A1 | 11/2004 | Miura et al. | |
| 2008/0238572 | A1* | 10/2008 | Funami | ................ H03H 9/6483 333/133 |
| 2010/0108248 | A1* | 5/2010 | Hayakawa | ............ H01L 41/312 156/247 |
| 2011/0109400 | A1* | 5/2011 | Koga | ..................... H03H 9/725 333/4 |

FOREIGN PATENT DOCUMENTS

| | | |
|---|---|---|
| JP | 2004-343359 A | 12/2004 |
| JP | 2008-5241 A | 1/2008 |
| JP | 2008-72771 A | 3/2008 |

* cited by examiner

*Primary Examiner* — Benny Lee
*Assistant Examiner* — Jorge Salazar, Jr.
(74) *Attorney, Agent, or Firm* — Chen Yoshimura LLP

(57) ABSTRACT

An acoustic wave filter includes a piezoelectric substrate, an insulating pattern that has higher thermal conductivity than the piezoelectric substrate formed on the piezoelectric substrate, at least two pads formed on the piezoelectric substrate or the insulating pattern, at least one pad formed on the insulating pattern, at least one acoustic resonator formed on the insulating pattern, and at least one acoustic resonator directly formed on the piezoelectric substrate.

18 Claims, 6 Drawing Sheets

ACOUSTIC WAVE DEVICE

This application claims the benefit of Japanese Application No. 2013-127368, filed in Japan on Jun. 18, 2013, which is hereby incorporated by reference in its entirety.

BACKGROUND OF THE INVENTION

1. Field of the Invention

The present invention relates to an acoustic wave device.

2. Description of Related Art

Acoustic wave devices are used as acoustic wave filters, duplexers, and modules including these, which are included in a mobile communication terminal. Among acoustic wave resonators included in acoustic wave devices are resonators that use waves such as surface acoustic waves (SAW) including leaky waves and love waves, boundary waves, bulk waves, and lamb waves. In a SAW filter, for example, a functional portion that generates an acoustic wave is a region where an interdigital transducer (IDT) electrode is formed.

Here, characteristic deterioration caused by temperature change is one of the problems with acoustic wave devices. Patent Document 1 and Patent Document 2 disclose techniques that improve frequency-temperature characteristics of SAW filters including IDT electrodes.

RELATED ART DOCUMENTS

Patent Documents

Patent Document 1: Japanese Patent Application Laid-Open Publication No. 2004-343359
Patent Document 2: Japanese Patent Application Laid-Open Publication No. 2008-72771

SUMMARY OF THE INVENTION

High power durability is required for components such as duplexers and filters used in communication devices such as cell phones. In a conventional configuration, high power durability was realized by bonding a substrate that has high thermal conductivity such as a sapphire substrate to a piezoelectric substrate in order to improve heat dissipation as disclosed in Patent Document 1, for example. However, with improvements in functionality of cell phones recently, reduced height and size is being demanded. The degree to which height and size can be reduced by the techniques disclosed in Patent Document 1 is limited. Also, the number of manufacturing steps increases, resulting in a high cost burden.

Additionally, the energy density of SAW resonators becomes greater in regions where IDT electrodes are formed and where an acoustic wave is generated. Heat cannot be sufficiently dissipated by the technique disclosed in Patent Document 2, because the resonator cannot dissipate heat directly from the regions where the IDT electrodes are formed. Thus, the SAW resonators disclosed in Patent Document 2 do not have sufficient power durability.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, an acoustic wave filter of the present invention includes a piezoelectric substrate, one or more insulating patterns formed on the piezoelectric substrate, the insulating pattern having higher thermal conductivity than the piezoelectric substrate, at least two pads formed on the piezoelectric substrate or the insulating pattern, at least one pad formed on the insulating pattern, at least one acoustic resonator including a first interdigital transducer, the first interdigital transducer being formed on the insulating pattern, and at least one acoustic resonator including a second interdigital transducer, the second interdigital transducer being directly formed on the piezoelectric substrate. The second interdigital transducer is included in at least one acoustic resonator. According to the above configuration, an acoustic wave filter having a sufficient power durability can be achieved.

In the above acoustic wave filter, the at least one pad formed on the insulating pattern may include any one of an input pad, an output pad, a ground pad, and a dummy pad.

Furthermore, in the above configuration, the second interdigital transducer may be directly connected to the pad formed on the insulating pattern, and the first interdigital transducer may be connected to the pad formed on the insulating pattern through interdigital transducer included in one or more other resonators.

Furthermore, the first interdigital transducer in the above acoustic wave filter is not directly connected to any pad.

The acoustic wave filter of the present invention may be a ladder type filter, and the first interdigital transducer may be included in a series resonator.

Furthermore, the ladder type filter may have a plurality of the series resonators connected in series, and the first interdigital transducer can be included in a second series resonator from an input pad.

The ladder type filter may have a plurality of the series resonators connected in series, and the first interdigital transducers may be included in second and third series resonators from an input pad.

The acoustic wave filter may be a ladder type filter. In this case, the first interdigital transducer may be included in a parallel resonator, and the first interdigital transducer may be directly connected to a ground pad.

The acoustic wave filter may further include a double mode type resonator.

Furthermore, the acoustic wave filter may include a double mode type resonator and a ladder type filter.

The above acoustic wave filter may further include a package substrate made of a multilayer substrate and a sealing portion. The piezoelectric substrate may be flip-chip connected onto the package substrate and sealed by the package substrate and the sealing portion.

The present invention includes a duplexer including the above acoustic wave filter. The duplexer including the above acoustic wave filter can achieve a sufficient power durability.

Furthermore, the present invention includes a module including a duplexer having above configuration and a power amplifier, which can achieve sufficient power durability.

In one aspect, an acoustic wave filter of the present invention includes a piezoelectric substrate, one or more insulating patterns that are directly formed on the piezoelectric substrate, the insulating pattern having higher thermal conductivity than the piezoelectric substrate, a plurality of pads that are directly formed on the piezoelectric substrate or the insulating pattern, and interdigital transducers included in a plurality of acoustic resonators that are directly formed on the piezoelectric substrate or the insulating pattern. An interdigital transducer included in at least one acoustic resonator, and at least one pad are formed on the same insulating pattern.

The insulating pattern may be made of a dielectric layer. Furthermore, the interdigital transducer formed on the insulating pattern in which at least one pad is formed may be included in at least any one of the following resonators (a) to (d): (a) a resonator connected to a pad through other resonators; (b) a resonator directly connected to a pad, the length between the resonator and the pad being longer than a prescribed length; (c) any one of a second resonator to a last resonators from an input pad among a plurality of series resonators, the plurality of series resonators being connected in series, the first resonator being directly connected to the input pad; and (d) a resonator included in a reception filter.

According to the present invention, an acoustic device having sufficient power durability while satisfying the demand for reduced height and size can be provided.

It is to be understood that both the foregoing general description and the following detailed description are exemplary and explanatory, and are intended to provide further explanation of the invention as claimed.

DETAILED DESCRIPTION OF THE PREFERRED EMBODIMENTS

Embodiment 1

Figure 1:
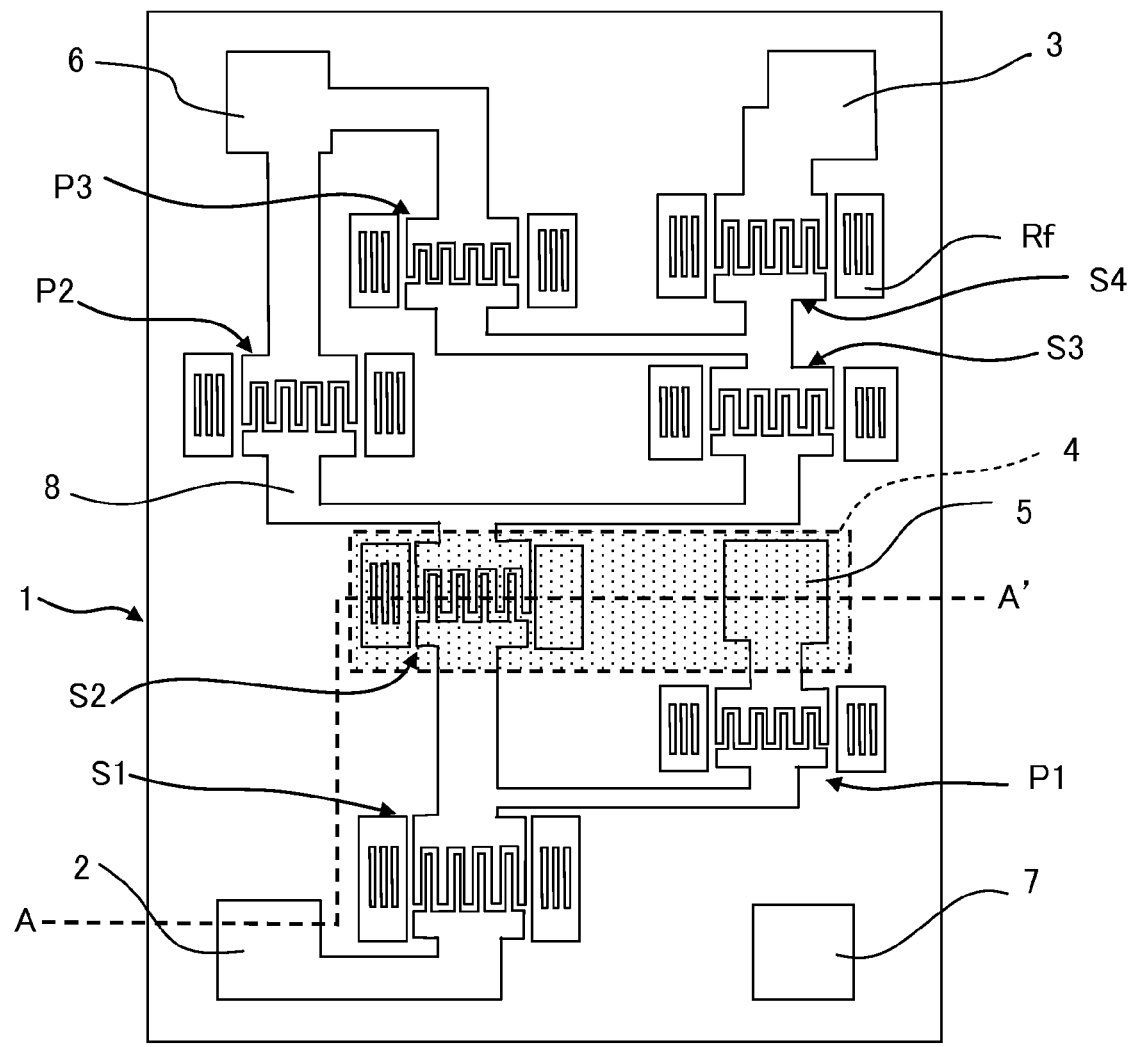
FIG. 1 is a top view illustrating a piezoelectric substrate of a SAW filter according to Embodiment 1.

FIG. 1 shows a structure of a piezoelectric substrate 1 of a SAW filter 100 according to Embodiment 1 of the acoustic wave device of the present invention.

As illustrated in FIG. 1, an input pad 2 to which an electrical signal is inputted and an output pad 3 from which the electrical signal is outputted are formed on the piezoelectric substrate 1. Also, series resonators S1, S2, S3, and S4 are connected between the input pad 2 and the output pad 3 in series, and IDT electrodes of the series resonators S1, S3, and S4 are formed directly on the piezoelectric substrate 1. An IDT electrode of the series resonator S2 will be described later. Also, parallel resonators P1 to P3 are connected to each other between the input pad 2 and the output pad 3 in parallel, and IDT electrodes of the parallel resonators P1 to P3 are directly formed on the piezoelectric substrate 1. The phrase "directly formed" means that resonators, pads, and the like are formed directly on the piezoelectric substrate. When the phrase "formed on" is used, the term encompasses not only a situation in which the resonators, pads, and the like are directly formed on the piezoelectric substrate 1, but also a case in which the resonators, pads, and the like are formed on another layer formed on the piezoelectric substrate.

An insulating pattern 4 is formed on the piezoelectric substrate 1. The series resonator S2, which is connected between the input pad 2 and output pad 3 in series, and a ground pad 5, which is directly connected to the parallel resonator P1, are formed on the insulating pattern 4. When elements such as resonators and pads are interposed between objects, these objects are not "directly connected." On the other hand, the objects are "directly connected" when a connecting element such as a wiring pattern is interposed between the objects. The connecting element includes wiring patterns that are configured to form, for instance, a meander pattern to form an inductance, and the connecting element is configured to form a capacitance.

Furthermore, a ground pad 6, which is formed in order to connect the parallel resonators P2 and P3 to a ground of a package substrate 11, and a dummy pad 7 are formed on the piezoelectric substrate 1. Although the dummy pad 7 does not contribute to electrical connection or affect the characteristics of the filter, the dummy pad 7 is formed from the point of view of stability of the piezoelectric substrate 1, which is mounted on the package substrate 11 by flip-chip bonding through bumps 12. As described later, the piezoelectric substrate 1 has a substantially rectangular shape in a plan view.

Here, the series resonator S2 is not directly connected to the ground pad 5 but is connected to the ground pad 5 through the parallel resonator P1. Each resonator includes IDT electrodes disposed between reflectors Rf. The resonators and the reflectors constitute a radar type filter.

Figure 2:
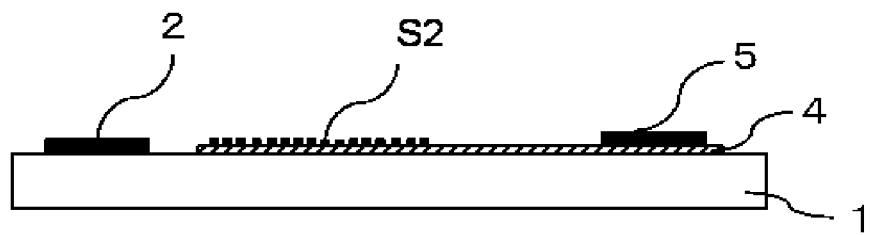
FIG. 2 is a cross-sectional view along the line A-A' in FIG. 1.

FIG. 2 is a cross-sectional view along the line A-A' in FIG. 1.

As illustrated in FIG. 2, the input pad 2 is directly formed on the piezoelectric substrate 1. The insulating pattern 4 is formed on the piezoelectric substrate 1, and the IDT electrodes of the series resonator S2 and the ground pad 5 are formed on the insulating pattern 4.

Examples of materials used for the piezoelectric substrate include lithium tantalate (coefficient of thermal conductivity thereof is approximately 5 W/mK (W: watt, m: meter, K: kelvin)), and lithium niobate (coefficient of thermal conductivity thereof is approximately 10 W/mK). The insulating pattern 4 is made of an insulating material that has a higher thermal conductivity than the piezoelectric substrate 1. Examples of materials used for the insulating pattern include but are not limited to, alumina (coefficient of thermal conductivity thereof is approximately 21 W/mK) and aluminum nitride (coefficient of thermal conductivity thereof is approximately 200 W/mK). Such a resonator formed on the insulating pattern 4 made of these materials has a higher heat dissipation efficiency than resonators that are directly formed on the piezoelectric substrate 1, and thus, the power durability of the resonator is improved.

Figure 3:
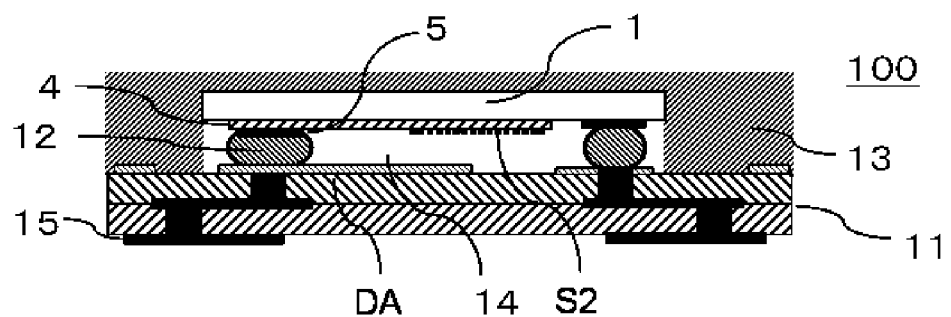
FIG. 3 is a cross-sectional view illustrating the SAW filter according to Embodiment 1.

FIG. 3 is a cross-sectional view illustrating the SAW filter 100.

As illustrated in FIG. 3, the piezoelectric substrate 1 is a flip-chip mounted on the package substrate 11 through bumps 12. The piezoelectric substrate 1 is sealed by the package substrate 11 and a sealing portion 13 so as to create a space where IDT electrodes, which are the functional portions where acoustic waves are generated, are able to vibrate while preventing the IDT electrodes from coming into contact with the outside air. The package substrate 11 includes a plurality of external connection terminals 15.

Heat that is generated by the series resonator S2 is dissipated to a die attach pattern DA through the insulating pattern 4, the pad 5, and the bump 12.

Figure 4A:
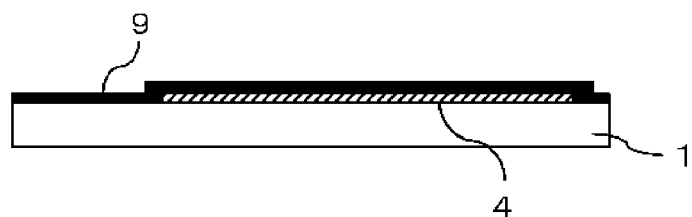
FIGS. 4A to 4C are cross-sectional views illustrating a method of fabricating the SAW filter according to Embodiment 1.
Figure 4B:
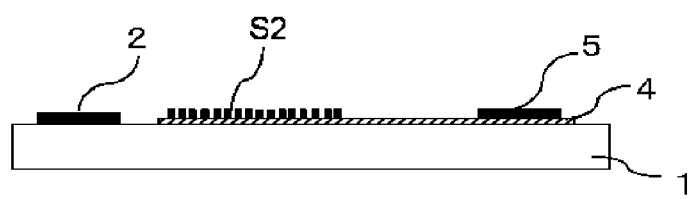
Figure 4C:
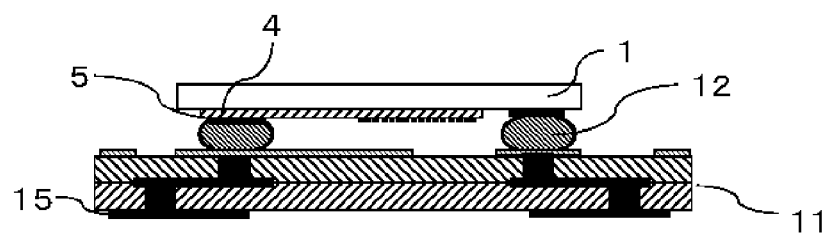

FIGS. 4A to 4C are cross-sectional views illustrating a method of fabricating the SAW filter 100 according to Embodiment 1.

As illustrated in FIG. 4A, alumina is selectively formed on the piezoelectric substrate 1 in a region where the IDT electrodes and reflectors of the series resonator S2 and the ground pad 5 are to be formed by, for example, vacuum deposition. As a result, the insulating pattern 4 is formed. Then, a metal layer 9 is formed on the piezoelectric substrate 1 and the insulating pattern 4. The thickness of the piezoelectric substrate 1 is 150 µm, for example. The thickness of the insulating pattern 4 is 100 nm, for example. The thickness of the metal layer 9 is 1 µm, for example. The metal layer 9 may be formed by, for example, stacking aluminum and titanium.

Then, as illustrated in FIG. 4B, the metal layer 9 is patterned so as to form the input pad 2, the IDT electrodes and reflectors of the series resonator S2, and the ground pad 5. In this manner, although not shown in FIG. 4B, the input pad 2, the output pad 3, IDT electrodes of other resonators S1, S3, S4, P1, P2, and P3, reflectors Rf, which are disposed on either side of each resonator, grounds pad 6, dummy pads 7, and wiring patterns 8 shown in FIG. 1 are simultaneously formed.

Then, as illustrated in FIG. 4C, the bumps 12 are formed on each pad, and the piezoelectric substrate 1 is mounted on the package substrate 11 by flip-chip bonding. Gold can be used as a material for the bumps 12, for example. Also, the piezoelectric substrate 1 can be bonded to the package substrate 11 by applying ultrasonic waves to the piezoelectric substrate 1 at the time of flip-chip bonding. Solder can be used instead of gold as the material for the bumps 12.

Then, the SAW filter 100, as illustrated in FIG. 3, is obtained by forming the sealing portion 13. Conductive materials such as solder and insulating materials such as resin can be used as the material for the sealing portion 13. It is preferable that the sealing portion 13 be made of metal such as solder in order to improve airtightness, heat dissipation, and the effectiveness of electromagnetic shielding.

The reason the IDT electrodes and reflectors of the series resonator S2 are formed on the insulating pattern 4 is that the IDT electrodes in specifically the series resonator S2, which is the second resonator from the input pad 2, are susceptible to damage.

More specifically, the energy density of each IDT electrode becomes higher because of the generation of acoustic waves when an electric signal is inputted into the input pad 2, and each IDT electrode generates heat. Here, heat can be dissipated with ease from the parallel resonators P1 to P3 through the ground pads 5 and 6, the parallel resonators P1 to P3 being directly connected to the ground pads 5 and 6. Also, heat is dissipated with ease from the series resonators S1 and S4 through the input pad 2 and the output pad 3, the series resonators S1 and S4 being directly connected to the input pad 2 and the output pad 3, respectively. However, the second and third series resonators from the input pad 2, i.e., the series resonators S2 and S3, are directly connected only to other resonators that generate heat, are not directly connected to any pads through the wiring pattern, and do not have paths through which heat can be dissipated, and thus, the heat tends to remain in the resonators.

Specifically, the series resonator S2 is directly connected to the series resonators S1 and S3 and the parallel resonators P1 and P2, and is not directly connected to any pads. Also, the series resonator S3 is directly connected to the series resonators S2 and S4 and the parallel resonators P2 and P3, and is not directly connected to any pads. Furthermore, compared to the series resonator S3, the series resonator S2 is more subject to the effects of the electrical power input from the input pad 2 because the series resonator S2 is closer to the input pad 2 in relation to the series resonator S3. As a result, the series resonator S2 is more susceptible to electrode damage than the series resonator S3. The series resonator S1 is most subject to the effect of electrical power input from the input pad 2. However, in view of the heat dissipation and electrical power input from the input pad 2, in many cases, the IDT electrode destruction tends to occur in the series resonators S2, S3, and S1, in that order.

The fragility of IDT electrodes, i.e., power durability, varies depending on various design parameters such as a pitch of IDT electrodes, a duty ratio (which is obtained by dividing the width of an electrode finger by the pitch of the electrode fingers), an aperture length, numbers of pairs of electrodes, and wiring patterns. Thus, damage to the IDT electrodes can be avoided to some extent by designs that take into consideration the power durability. However, design flexibility to improve resonance characteristics is impaired by considerations of power durability. On the other hand, by applying this invention, the design flexibility of various kinds of parameters of IDT electrodes can be increased by improving the power durability and heat dissipation of resonators.

According to the configuration above, the heat generated in the series resonator S2 is transmitted to the ground pad 5 through the insulating pattern 4. The heat can be dissipated because the ground pad 5 is connected to the die attach pattern DA formed on the package substrate through the bump 12. Thus, the series resonator S2 has a high degree of heat dissipation and a high power durability. The resonator formed on the insulating pattern 4 has a smaller electromechanical coupling coefficient, but the impact thereof on electric signal loss or the like is negligible. Additionally, as a result of the smaller electromechanical coupling coefficient, the skirt characteristics in the high frequency edge of the passband of the series resonator S2 can be made sharper.

Figure 5:
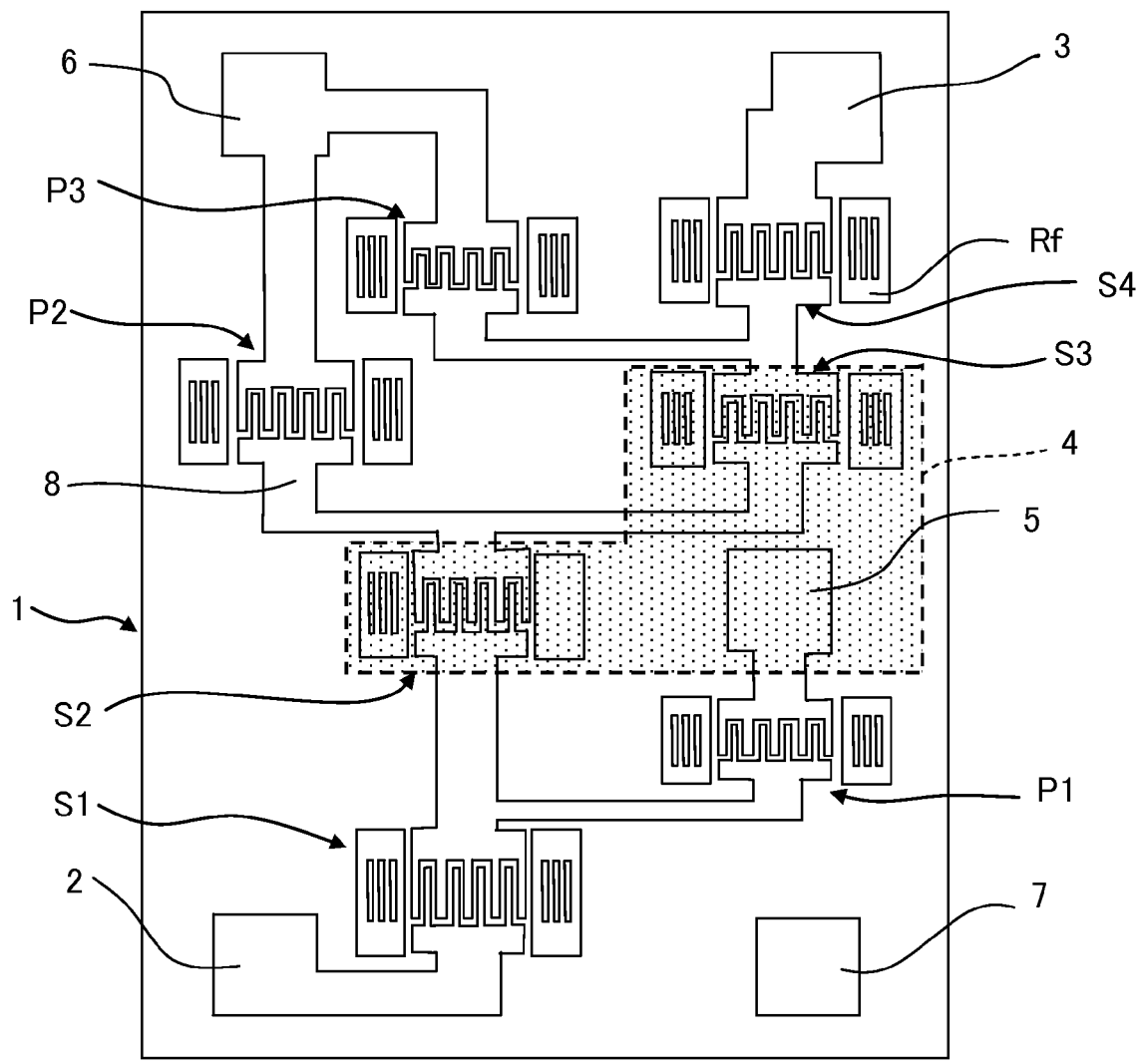
FIG. 5 is a top view illustrating Modification Example 1 of Embodiment 1.

FIG. 5 is a top view illustrating a structure of a piezoelectric substrate of a SAW filter of Modification Example 1 of Embodiment 1.

The difference between the Modification Example 1 and Embodiment 1 is that the series resonator S3, which is third resonator from the input pad 2, is also formed on the insulating pattern 4. As the structure of Modification Example 1 has a higher degree of heat dissipation than the structure of Embodiment 1, damage to the IDT electrodes can be further mitigated. Because the other configurations of Modification Example 1 are the same as those of Embodiment 1, explanations thereof are omitted.

Figure 6:
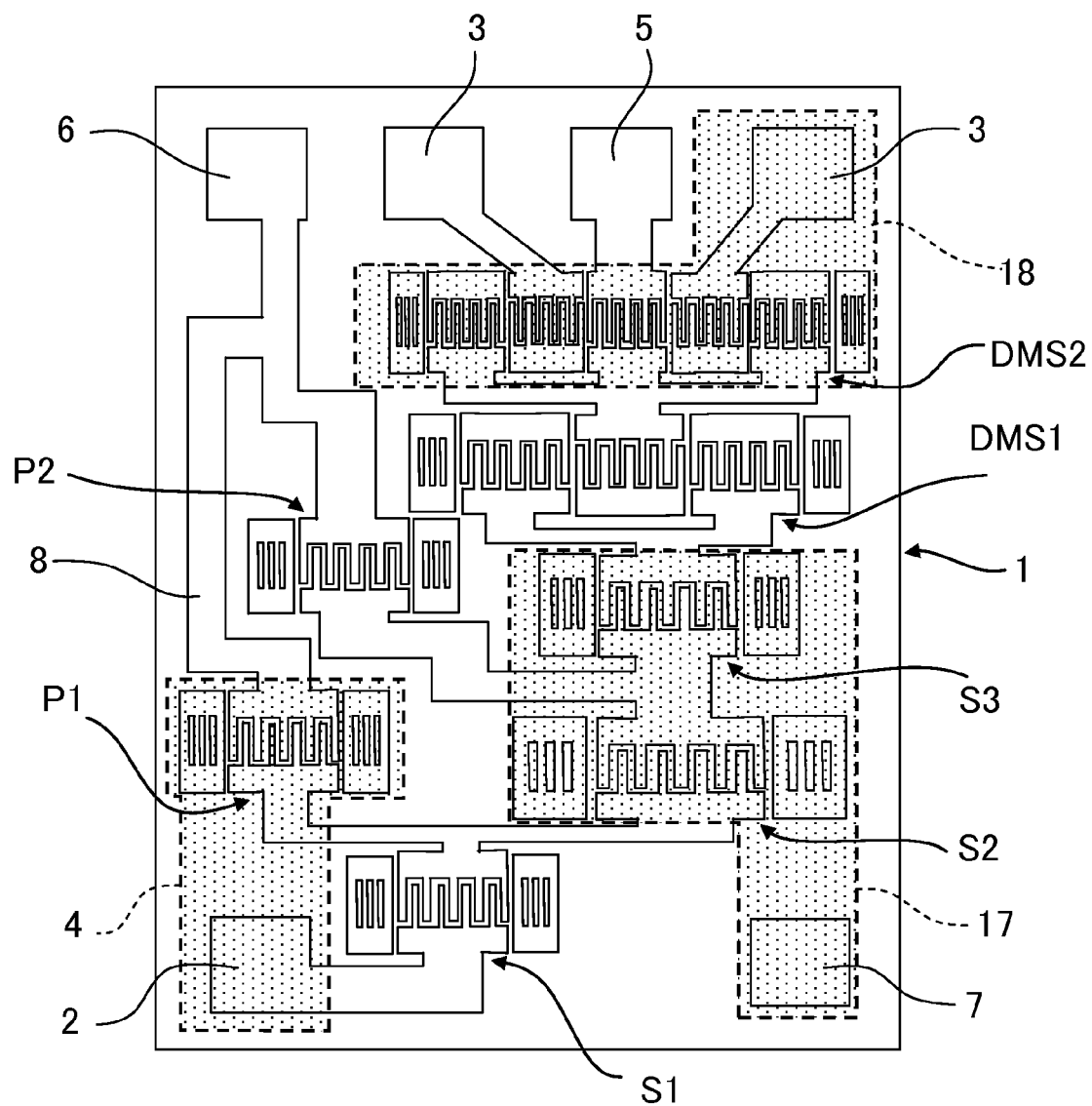
FIG. 6 is a top view illustrating Modification Example 2 of Embodiment 1.

FIG. 6 is a top view illustrating a structure of a piezoelectric substrate of a SAW filter of Modification Example 2 of Embodiment 1.

Modification Example 2 is a SAW filter that includes a ladder type filter and double mode type resonators DMS and DMS2. As illustrated in FIG. 6, both the parallel resonator P1 and the input pad 2 are formed on the insulating pattern 4. Also, in Modification Example 2, the insulating pattern is not formed under the ground pad 5. Modification Example 2 is a balance output type filter and includes two output pads 3. The SAW filter of Modification Example 2 is mainly used as a reception filter.

Here, the wiring pattern 8, which is used to connect to the ground pad 6, is sometimes long depending on the position of each resonator. In the case of Modification Example 2, although the parallel resonator P1 is directly connected to the ground pad 6, the heat dissipation is not sufficient because the length of the wiring pattern 8 between the parallel resonator P1 and the input pad 2 is great. Thus, the IDT electrodes of the parallel resonator P1 are susceptible to damage.

In a case in which a SAW filter is used as the reception filter, the IDT electrodes are not as susceptible to damage because an electric power input from an antenna is weaker than an electric power input to a transmission filter through a power amplifier. On the other hand, when a SAW filter is used as an element of a duplexer, damage to the IDT electrodes of the reception filter of the duplexer can happen due to a reflected signal inputted to the reception filter. The reflected signal is a portion of the transmission signal reflected in the antenna because of impedance mismatch between the transmission signal and the antenna when the transmission signal is outputted from the transmission filter.

Such damage to the specific IDT electrodes of the reception filter used as an element of a duplexer can be prevented by forming the insulating pattern 4 as a heat dissipation path from the parallel resonator P1 to the input pad 2 adjacent to the parallel resonator P1. Additionally, by forming the parallel resonator P1 on the insulating pattern 4, the electromechanical coupling coefficient thereof is made smaller, and the skirt characteristics in the low frequency end of the passband of the parallel resonator P1 can be made sharper.

Furthermore, an insulating pattern can be formed on a region 17 surrounded by the dashed line in FIG. 6, i.e., under the dummy pad 7, and IDT electrodes and reflectors of the series resonators S2 and S3. Furthermore, the insulating pattern can be formed on a region 18 surrounded by the broken lines, i.e., under the output pad 3, and IDT electrodes and reflectors of the double mode type resonator DMS2. As a result, the destruction of the IDT electrodes can further be suppressed.

Embodiment 2

Figure 7:
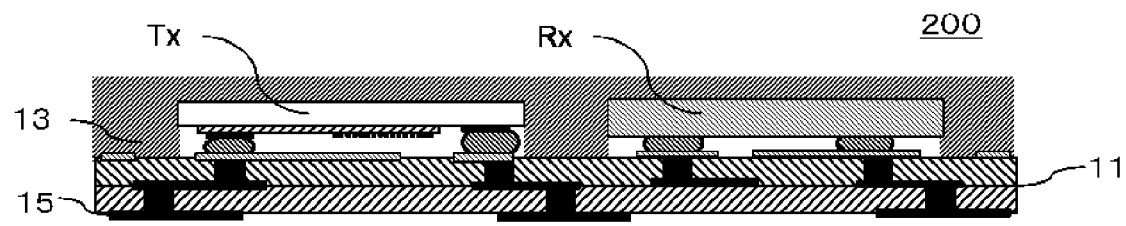
FIG. 7 is a cross-sectional view illustrating a duplexer according to Embodiment 2.

FIG. 7 is a cross-sectional view illustrating a duplexer 200 according to Embodiment 2 of the acoustic device of the present invention.

The duplexer 200 of Embodiment 2 includes a transmission filter Tx and a reception filter Rx formed on a package substrate 11 and sealed by a sealing portion 13. The package substrate 11 is constituted of a multilayer insulating substrate in which a wiring layer is formed between insulating substrates. The wiring layer may include a ground pattern, and a matching circuit formed by a wiring pattern routing structure. A die attach pattern DA, the wiring layer, and an external connection terminal 15 are electrically connected to each other by a plurality of vias that are formed in through-holes penetrating the insulating substrate.

The duplexer 200 of Embodiment 2 includes the SAW filter 100 of Embodiment 1 as the transmission filter Tx. The SAW filter of Modification Example 2 of Embodiment 1 or various types of filters operating with acoustic waves can be used as the reception filter Rx.

Damage to IDT electrodes becomes more of a problem when a ladder type SAW filter is used as a transmission filter than when the ladder type SAW filter is used as a reception filter. When a transmission signal amplified by a power amplifier PA is inputted to the transmission filter, more heat is generated. Therefore, the duplexer, which is not susceptible to damage caused by the electric power of the transmission signal amplified by the power amplifier PA, can be obtained by adopting the SAW filter 100 of Embodiment 1 as the transmission filter Tx. The electromechanical coupling coefficient of the series resonator formed on the insulating pattern 4 becomes smaller, which results in a decreased anti-resonance frequency, causing the resonance characteristics to become steeper, which improves isolation between the transmission filter and the reception filter.

Needless to say, the duplexer of the acoustic device of Embodiment 2 according to the present invention can adopt any filters of Embodiment 1 or Modification Examples 1 and 2 of Embodiment 1 as the transmission filter and/or the reception filter thereof.

Embodiment 3

Figure 8:
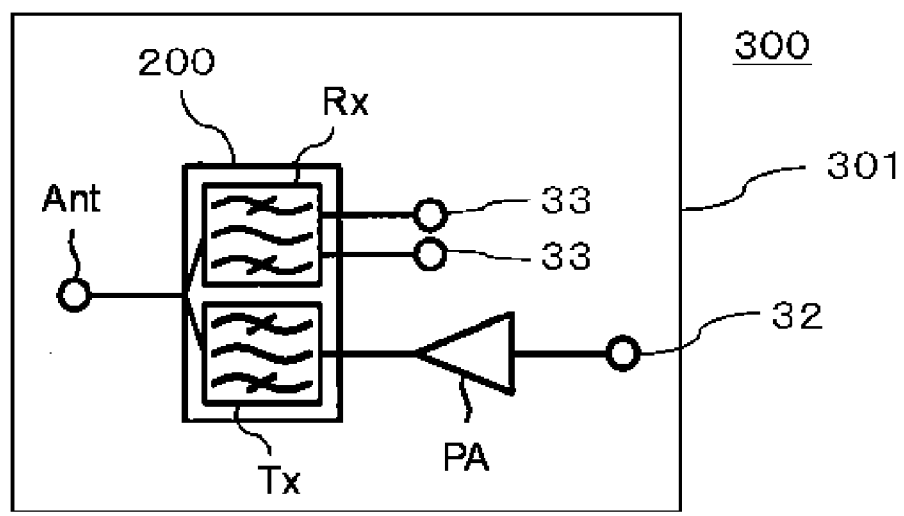
FIG. 8 is a view illustrating a module circuit diagram according to Embodiment 3.

FIG. 8 is a block diagram illustrating a module 300 (acoustic wave device) according to Embodiment 3 of the present invention.

The module of Embodiment 3 contains the duplexer 200 of Embodiment 2 and the power amplifier PA, which amplifies the transmission signal, the duplexer 200 and the power amplifier PA being formed on a module substrate 301, which is constituted of a multilayer insulating substrate. The module 300 is configured such that a reception signal inputted to an antenna terminal Ant is outputted from output terminals 33 corresponding to the balanced outputs through the reception filter Rx included in the duplexer 200. Furthermore, the module 300 is configured such that a transmission signal inputted to an input terminal 32 is outputted from the antenna terminal Ant through the power amplifier PA and the transmission filter Tx included in the duplexer 200.

In the module 300 of Embodiment 3, during reception, the reception filter Rx allows through only signals having prescribed frequency bands from the reception signals inputted from the antenna terminal Ant, and outputs the signals from the output terminals 33 to the outside. Furthermore, during transmission, the transmission filter Tx allows through only signals having prescribed frequency bands from the transmission signals inputted from the input terminal 32 and amplified by the power amplifier PA, and outputs the signals from the antenna terminal Ant to the outside.

The module 300 of Embodiment 3 may contain not only the duplexer 200 of Embodiment 2 but also one or more other duplexers. Furthermore, in a case in which the module 300 includes a plurality of duplexers, the module 300 may have a switch (not shown) to select and activate one or more duplexers.

Accordingly, the module 300, which is not susceptible to electrode damage caused by the electric power of the transmission signal amplified by the power amplifier PA, can be obtained by adopting the duplexer 200 of Embodiment 2.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. An acoustic wave filter, comprising:
   a piezoelectric substrate;
   an insulating pattern directly formed on a top surface of said piezoelectric substrate, said insulating pattern having a higher thermal conductivity than said piezoelectric substrate and being patterned to partially expose the top surface of the piezoelectric substrate;
   a first acoustic wave resonator including a first interdigital transducer, said first interdigital transducer being directly formed on said insulating pattern; and
   a second acoustic wave resonator including a second interdigital transducer, said second interdigital transducer being directly formed on said partially exposed top surface of said piezoelectric substrate.

2. The acoustic wave filter according to claim 1, further comprising any one of an input pad, an output pad, a ground pad, and a dummy pad formed on the insulating pattern or on the partially exposed top surface of said piezoelectric substrate.

3. The acoustic wave filter according to claim 1, further comprising a pad formed on said insulating pattern, wherein said second interdigital transducer is directly connected to said pad formed on said insulating pattern, and said first interdigital transducer is connected to said pad formed on said insulating pattern through said second interdigital transducer included in said second acoustic wave resonators.

4. The acoustic wave filter according to claim 1, wherein said first interdigital transducer is not directly connected to any pad formed on the insulating pattern or on the partially exposed top surface of said piezoelectric substrate.

5. The acoustic wave filter according to claim 1, wherein the acoustic wave filter is a ladder type filter, and said first interdigital transducer is included in a series resonator.

6. The acoustic wave filter according to claim 5, further comprising an input pad formed on the insulating pattern or on the partially exposed top surface of said piezoelectric substrate, wherein said ladder type filter has a plurality of said series resonators connected in series, and said first interdigital transducer is included in a second series resonator from said input pad.

7. The acoustic wave filter according to claim 5, further comprising:
    an input pad formed on the insulating pattern or on the partially exposed top surface of said piezoelectric substrate; and
    a third acoustic wave resonator including a third interdigital transducer, said third interdigital transducer being directly formed on said insulating pattern,
    wherein said ladder type filter has a plurality of said series resonators connected in series, and said first and third interdigital transducers are included in second and third series resonators, respectively, from said input pad.

8. The acoustic wave filter according to claim 1,
    wherein the acoustic wave filter is a ladder type filter, and
    wherein the first interdigital transducer is included in a parallel resonator of the ladder type filter, and is directly connected to a ground pad.

9. The acoustic wave filter according to claim 1, further comprising a double mode type resonator.

10. The acoustic wave filter according to claim 1, further comprising a double mode type resonator and a ladder type filter.

11. The acoustic wave filter according to claim 1, further comprising:
    a package substrate made of a multilayer substrate; and
    a sealing portion,
    wherein said piezoelectric substrate is flip-chip connected to said package substrate and sealed by said package substrate and said sealing portion.

12. The acoustic wave filter according to claim 1, wherein the acoustic wave filter uses surface acoustic waves.

13. The acoustic wave filter according to claim 1, wherein said insulating pattern is made of aluminum nitride.

14. A duplexer, comprising the acoustic wave filter according to claim 1.

15. A module, comprising the duplexer according to claim 14 and a power amplifier.

16. An acoustic wave filter, comprising:
    a piezoelectric substrate;
    an insulating pattern directly formed on a top surface of the piezoelectric substrate, the insulating pattern having a higher thermal conductivity than the piezoelectric substrate, and being patterned to partially expose the top surface of the piezoelectric substrate;
    a plurality of pads that are directly formed on the partially exposed top surface of the piezoelectric substrate or on the insulating pattern; and
    interdigital transducers respectively included in a plurality of acoustic wave resonators said interdigital transducers being directly formed on the partially exposed top surface of the piezoelectric substrate or on the insulating pattern,
    wherein at least one of said interdigital transducer and at least one of said plurality of pads are formed directly on the insulating pattern.

17. The acoustic wave filter according to claim 16, wherein the insulating pattern is made of a dielectric layer.

18. The acoustic wave filter according to claim 16, wherein said one of said interdigital transducers formed on the insulating pattern on which said at least one of said plurality of pads is formed is included in at least any one of the following resonators (a) to (d):
    (a) a resonator connected to said one of said plurality of pads formed on the insulating pattern through another resonator;
    (b) a resonator directly connected to another of said plurality of pads, the length between the resonator and said another of said plurality of pads being longer than a prescribed length;
    (c) any one of a second resonator to a last resonator from an input pad among a plurality of series resonators, the plurality of series resonators being connected in series, a first resonator among the plurality of series resonators being directly connected to the input pad; and
    (d) a resonator included in a reception filter.

* * * * *